（12）United States Patent
Potemkin et al.

(10) Patent No.: US 9,640,751 B2
(45) Date of Patent: May 2, 2017

(54) DEVICE FOR PRECISION DISPLACEMENT

(76) Inventors: Alexander Potemkin, Barsbuettel (DE); Petr Nikolaevich Luskinovich, Moscow (RU); Vladimir Alexandrovich Zhabotinsky, Moscow (RU)

( * ) Notice: Subject to any disclaimer, the term of this patent is extended or adjusted under 35 U.S.C. 154(b) by 548 days.

(21) Appl. No.: 14/122,976

(22) PCT Filed: Jun. 28, 2011

(86) PCT No.: PCT/EP2011/003173
§ 371 (c)(1),
(2), (4) Date: Feb. 13, 2014

(87) PCT Pub. No.: WO2012/163378
PCT Pub. Date: Dec. 6, 2012

(65) Prior Publication Data
US 2014/0152151 A1    Jun. 5, 2014

(30) Foreign Application Priority Data

Jun. 1, 2011 (WO) .................. PCTEP2011/002706

(51) Int. Cl.
*H01L 41/09* (2006.01)
*H01L 41/047* (2006.01)
*H02N 2/02* (2006.01)

(52) U.S. Cl.
CPC ...... *H01L 41/0478* (2013.01); *H01L 41/0471* (2013.01); *H01L 41/09* (2013.01); *H01L 41/0986* (2013.01); *H01L 41/0993* (2013.01); *H02N 2/02* (2013.01)

(58) Field of Classification Search
CPC . H01L 41/098; H01L 41/0993; H01L 41/047; H02N 2/02

USPC .......... 310/328, 366, 365, 363, 311, 323.17
IPC .......................................... H01L 41/047,41/09
See application file for complete search history.

(56) References Cited

U.S. PATENT DOCUMENTS

| 4,384,230 | A | * | 5/1983 | Wisner | H01L 41/042 |
|||||| 310/328 |
| 4,787,148 | A |  | 11/1988 | Myer |  |
| 5,438,469 | A | * | 8/1995 | Rudi | G11B 5/5504 |
|||||| 360/77.12 |
| 5,714,832 | A | * | 2/1998 | Shirrod | A61B 1/227 |
|||||| 310/328 |

(Continued)

FOREIGN PATENT DOCUMENTS

| RU | 2284464 | * | 6/2006 | ......... H01L 41/0993 |
| WO | WO 2006/083191 A1 | | 8/2006 | |
| WO | WO 2006/092035 A1 | | 9/2006 | |

OTHER PUBLICATIONS

International Search Report dated Sep. 1, 2013 with partial English translation (eleven (11) pages).

(Continued)

*Primary Examiner* — Thomas Dougherty
*Assistant Examiner* — Karen B Addison
(74) *Attorney, Agent, or Firm* — Crowell & Moring LLP

(57) ABSTRACT

A device for performing a precision movement comprising a plate composed of piezoelectric material and comprising electrodes which are provided at mutually opposite and preferably parallel planes, are connectable to a controlled voltage source having electrical voltage and in this case bring about a change in the form and/or mass of the plate is characterized in that at least one of the electrodes is designed in an elastic fashion to form a base module.

2 Claims, 7 Drawing Sheets

(56) References Cited

U.S. PATENT DOCUMENTS

| | | |
|---|---|---|
| 6,028,008 A | 2/2000 | Bayer et al. |
| 2002/0108398 A1 | 8/2002 | Smith et al. |
| 2004/0248503 A1 | 12/2004 | Benderly |

OTHER PUBLICATIONS

English Translation of International Preliminary Report on Patentability dated Dec. 12, 2013 (11 pages).
International Preliminary Report on Patentability dated Feb. 6, 2014 (PCT/IB/338) and (PCT/IB/373), including Written Opinion (PCT/ISA/237) (eight (8) pages).

* cited by examiner

DEVICE FOR PRECISION DISPLACEMENT

CROSS REFERENCE TO RELATED APPLICATIONS

This application is a National Stage of PCT International Application No. PCT/EP2011/003173, filed Jun. 28, 2011, which claims priority under 35 U.S.C. §119 from PCT International Application No. PCT/EP2011/002706, filed Jun. 1, 2011, the entire disclosures of which are herein expressly incorporated by reference.

BACKGROUND AND SUMMARY OF THE INVENTION

The invention relates to a device of the generic kind for precision displacement. The invention belongs to the field of precision apparatus engineering and can be used for precise (dimensional) displacements and linear variables in the nanometer range and also as a calibration standard for profilometers.

What is known is a device for precision movement, which guarantees a linear displacement in the nanoscale (U.S. Pat. No. 4,787,148). In essence, the known device is an improvement of the known micrometer, which is supplied with a corresponding transfer value via a two-stage mechanical reducer.

Drawbacks of the known device are the rather low degree of accuracy of the inputted displacement and the low degree of reproducibility of the results, namely due to hysteresis and a material having creep strain.

What is known is a more precisely operating device which is used for testing profilometers and scanning probe microscopes. This device has a monocrystalline plate which contains step-wise recesses in microelectronic technology, wherein each step is made with the same defined height (U.S. Pat. No. 6,028,008).

The transfer of the linear value by means of such a device can, on account of the distribution of its development in the series production, only be realized when a plurality of measurements are made in various surface regions and the measurement results are subsequently processed mathematically.

This device is characterized by certain defects. By means of this device it is only possible to measure linear displacements in one direction, namely in the depth. If an etching method is additionally applied for the development, the accuracy of the development of the step height can form several atomic layers, and considering that the parameter of the crystal lattice for silicon equals 0.5 nm, the non-determinability of the step height will be 5-7 nm, which is unusable for a number of applications.

Similar devices in the form of a recess of a differently wide nanometer region are used for calibration on a plane. However, the development thereof requires the use of nanotechnological processes.

A defect of these devices is the instability in their dimensions resulting from the collection of dust, the precipitation of a layer adsorbed to the surface and the course of physicochemical processes, such as migration, diffusion and oxidation.

Closest to the invention is the device of the generic kind for precision movement, comprising electrodes which are attached to the bottom of a plate made of a piezoelectric material, are applied to two opposite sides thereof and are connected to an electrical voltage source (WO 2006/083191 A1).

A defect of this known device is the instability in the device parameters, in particular the lack of long-term stability in the use thereof.

Therefore, the object of the invention is to provide the device of the generic kind with better stability during operation. This object is achieved by the subject matter of the claims.

The devices for precision movement, which are described in the invention, serve for complying with the parameters during operation and for reducing the non-determinability of the extent of displacement.

All described devices for precision movement are based on a physical principle of the controlled change in the geometric dimensions of the plate made of a piezoelectric material when an electrical voltage is applied thereto. Since the electrodes are made to be elastic thereby forming a base module, no disturbing and distorting mechanical stresses are formed in the region between the electrodes and the surfaces connected thereto, such as those of a bottom or reading or protecting layer or plane. This base module can be used in the various embodiments of the invention.

All described embodiments of the invention aim at the repeatable precise obtainment of one and the same technical result as well as the guaranteed provision of the parameters during operation and the reduction in the non-determinability of the displacement.

This is achieved in that both a first embodiment of the device according to the invention for precision movements and the subject matter of the inventions contain a plate which is connected to the bottom and is made of a piezoelectric material and onto which electrodes are applied to two opposite parallel sides thereof, wherein said electrodes are connected to an electrical voltage source, which, when a dc voltage is applied to the electrodes, ensure the change in the dimensions and the form of the plate in a rectangular or parallel direction relative to the plane of the electrodes, wherein several identical plates are disposed between said plate made of a piezoelectric material and the bottom, between which elastic electrodes are distributed to which voltages (+U) of the same value and direction are applied.

Said result is also obtained by making the plates of a material having low hysteresis degrees.

Said result is also obtained by making the plates of a material having a low degree of creep strain.

A defect of the subject matter of the invention in relation to the first embodiment of the proposed device is the instability in the compliance with the operating characteristics. This is explained by the fact that the geometric dimensions of the plate made of a piezoelectric material including the environment are changed when a voltage is applied to the electrodes, which is disposed on the bottom, which does not change its dimensions. A change in the geometric dimensions of the plate accompanied by an invariability of the dimensions of the environment of the contact with the bottom simultaneously creates forces which are directed to the displacement of the plate in relation to the bottom, which results in an elastic and non-elastic deformation and in a change in the operating characteristics.

The embodiment of the device for precision movement in the form of the support of some plates made of a piezoelectric material allows the application of a reduced voltage to each of the plates so as to ensure the necessary summary displacement of the device in the direction of the rectangular or correspondingly oriented plane of the electrodes.

If elastic electrodes are arranged between the plates, they have no influence on the change in the geometric dimensions of each of the plates and therefore there will be no mechanical stresses in either the region of contact with the bottom or among themselves, which can virtually result in zero forces on the plate. In this way, the parameters of the device will change less during use, and the time of operation of the device in compliance with the operating parameters thereof is prolonged considerably in terms of a long-term precision.

It is most useful to make the plates of a material having a low degree of hysteresis (of unclear loop-like dependency of the polarization of the ferrodielectricity on the outer electric field E in its cyclic change) and a creep strain (of the delay of the response to a change in the value of the controlled electric field).

In this case, the undeterminability of the controlled change in the geometric dimensions of each of these plates is reduced and the stability of the parameters is increased. The development of the device for precision movement in the form of plates made of a piezoelectric material having a low degree of hysteresis and creep strain with electrodes which are applied to two opposite sides thereof and are connected to voltage sources, allows to guarantee the repeatability of extremely small, hardly determinable displacements of the piezoelectric plate when a voltage is applied to the electrodes. Correspondingly, when a desired non-determinability of the measurement is set, it is also possible to select an appropriate material which has a corresponding hysteresis that ensures this. With an opposite piezoelectric effect, monocrystals have the least degree of hysteresis and creep strain, and therefore it is most useful to make the plate of a monocrystalline piezoelectric material.

A defect of the known device which was selected as the subject matter of the invention in relation to the second embodiment is a rather small region of displacement in the vertical plane (in the direction rectangular to the plane of the electrodes), which limits the application range. In order to increase the region of displacement in a vertical plane, the increase in the geometric dimension of the plate made of a piezoelectric material makes necessary an increase in the voltage that is applied to the electrodes. This is highly undesirable in many cases and can lead to an instability in the operating characteristics. If such a plate made of a piezoelectric material is used with electrodes that are applied to two opposite, parallel sides and are connected to a voltage source as well as formed so as to ensure the change in the dimensions of the plate in the direction parallel to the plane of the electrodes when a voltage is applied to the electrodes, the distribution can be many times greater. Even if such a plate is attached to the bottom in such a way that the electrodes extend vertically thereto, the geometric dimensions of the plate change when the voltage is applied in such a way that the plate changes from a rectangular parallelepiped into an inclined prism (FIG. 2).

Due to the development of the device for precision movement in the form of a plate made of a piezoelectric material, wherein electrodes are applied to two opposite parallel sides of the plate, said electrodes being connected to voltage sources, and, when a voltage is applied to the electrodes, the change in the dimensions of the plate in the direction of the parallel plane of the electrodes and the attachment of the plate which is connected to one of the electrodes on the vertical area and to the bottom of the console, and to the second electrode which is connected to the reading area of the console via the vertical area of the parallel plane of this electrode, it is possible to essentially increase the displacement region in the direction of the vertical plane. In fact, the proposed embodiment of the development of the plate made of a piezoelectric material, wherein electrodes are applied to two opposite parallel sides of the plate, said electrodes being connected to voltage sources and effect a change in the dimensions of the plate in the direction parallel to the plane of the electrodes when the voltage is applied to the electrodes, ensures a large displacement region in the direction of the plane of the electrodes. The embodiment including the plate made of a piezoelectric material, wherein electrodes are applied to two parallel opposite sides of the plate, said electrodes being connected to voltage sources, thus ensures the change in the dimensions of the plate in the direction at right angles to the plane of the electrodes when a voltage is applied to the electrodes.

The device is equipped partially by developing a second plate made of a piezoelectric material, which is identical to the first one and is attached in such a way that an electrode is fixed to a console, which is connected to the reading area, namely on the vertical area thereof which is opposite to the one to which the first plate is attached; the second electrode is connected to the vertical area of the third console that is connected to the bottom, which allows a compensation of the lateral displacement of the console with the reading area (due to equal and opposite lateral displacements of the piezo plates), the increase in the bending strength of the design and the creep strain with respect to external vibrations. It is most useful for the plate to be made of a monocrystalline material having a low degree of hysteresis and creep strain in order to reduce undeterminable displacements.

In a further embodiment of the development of the device, said result is obtained because the device for precision movement contains a plate which is connected to the bottom and is made of a piezoelectric material, wherein electrodes are applied to two opposite parallel sides of the plate, said electrodes being connected to voltage sources and, when a voltage is applied, ensure a change in the dimensions of the plate in the direction at right angles to the plane of the electrodes, wherein the plate is fixed to the upper electrode on the lower area of an L-shaped first console, said area extending horizontally with respect to the bottom. The lower electrode of the base module is connected to the lower region (first U-shaped leg) of a U-shaped second console, and the lower electrode of the further base module is connected to the upper horizontal area of the upper region of the horizontally guided second U-shaped leg of the second console, wherein the reading area is disposed on the upper electrode thereof.

Said result is also only obtained by making the plates of a material having a low degree of hysteresis.

Said result is also only obtained by making the plates of a material having a low degree of creep strain.

A defect of the known device which in relation to the further invention of the described group was selected as a subject matter of the invention consists in that a change in the geometric dimensions of the plate is possible as a result of a change in the ambient temperature and also due to the lateral displacement of the plate and when the control voltage is applied. Said circumstance has a negative influence on the compliance with the parameters of the device during operation and the undeterminability of the displacement.

The attachment of the first plate to the upper electrode on the lower horizontal area of the first console and the lower electrode on the upper horizontal area of the lower head piece (lower U-shaped leg of the second console) of the horizontally adjusted U-shaped console and the attachment of the second plate identical to the first one to the lower electrode thereof on the upper area of the upper head piece (upper U-shaped leg of the second console) of the second console allow the elimination of the influence of the change in the geometric dimensions of the plate, namely as a result of the lateral displacement due to the control voltage and the change in the ambient temperature due to the displacement of the reading area. If the device (and correspondingly the two plates) are actually in the changing temperature field or under the influence of the control voltage and when the first (lower) plate is expanded, the lower head piece of the U-shaped second console, to which it is attached, is displaced downwardly, which also results in a displacement of the upper head piece of the U-shaped second console. The second plate attached thereto also expands and pulls the reading area upwards to this very distance to which the P-shaped console is displaced downwardly, wherein the first (lower) plate is displaced laterally, which results in a temperature compensation.

In a further embodiment of the device according to the invention, said result is obtained because the device for precision movement contains a plate made of a piezoelectric material, wherein the plate is disposed on the bottom and the electrodes are applied to two parallel opposite sides thereof, said electrodes being connected to the voltage source, which, when a voltage is applied to the electrodes, ensure the change in the dimensions of the plate in a rectangular direction or parallel plane of the electrodes, wherein the plane of the plate contains electrodes which are divided into several parts and have intermediate spaces and the electrodes of all parts are connected to the general voltage source, wherein there is, above the plates, a carrier covering them all and having a reading area, the temperature coefficient of expansion of which is equal to the temperature coefficient of expansion of the bottom.

Said result is also obtained by making the plates of a material having a low degree of creep strain.

Compared to the other embodiments of the invention, the advantage of the above described one is that the bottom and the plate made of a piezoelectric material have no differing coefficients of thermal expansion. Therefore, a change in temperature does not create any mechanical stresses which lead to forces that due to the displacement of the plate in relation to the bottom produce mechanical stresses in the attachment region thereof, which results in changes in the operating characteristics thereof and in a mechanical tear-off. If the plate is split into several parts, forces result under these conditions—in addition to the one that the contact area of each part becomes smaller at the electrodes compared to the entire plate—, said forces acting on the displacement of the plate in relation to the bottom, namely caused by different coefficients of thermal expansion of the bottom and the plate made of a piezoelectric material, which also become smaller. In this way, the device remains in stable operation for an essentially prolonged period of time and complies with the operating characteristics thereof.

The covering of the plate with a carrier increases the protection in the process of use by increasing the stability with respect to the external mechanical influences, the mechanical stability of the device for precision movement and a uniform distribution of the external charge. The carrier must be made with a temperature coefficient of expansion which is equal to the temperature coefficient of expansion of the bottom so as to avoid mechanical stresses on the electrodes of the upper and lower areas of the plate when the temperature range is changed.

In the last embodiment of the development of the device, said result is obtained because the device for precision movement contains on the bottom of the plate made of a piezoelectric material two electrodes on two opposite parallel sides thereof, said electrodes being connected to a voltage source and, when the voltage is applied to the electrodes, ensure the change in the dimensions of the plate in the direction of the rectangular or parallel plane of the electrodes, wherein the plate is made with electrodes which in the plane are divided into several parts having intermediate spaces; the electrodes of all parts are connected to the general voltage source, wherein two carriers having reading areas with intermediate spaces are disposed above the plates, said carriers covering the plates and having a temperature coefficient of expansion that is equal to the temperature coefficient of expansion of the bottom.

Said result is also obtained by making the plates of a material having a low degree of hysteresis.

Said result is also obtained by making the plates of a material having a low degree of creep strain.

Said result is also obtained because at least one marking of the value of one atom of the substance up to several hundred nanometers is disposed on the upper reading area.

Due to the covering of the plate by two carriers having intermediate spaces it is possible to exclude the influence of a thermal expansion of the plate and shorten the time of measurement when the corresponding controlled displacement of the upper reading areas is measured. This reduces the influence of a slow change in the position of the measuring instrument with the collaboration of a thermal drift, a mechanical relaxation, etc.

Other objects, advantages and novel features of the present invention will become apparent from the following detailed description of one or more preferred embodiments when considered in conjunction with the accompanying drawings.

DETAILED DESCRIPTION

Example 1

Figure 1:
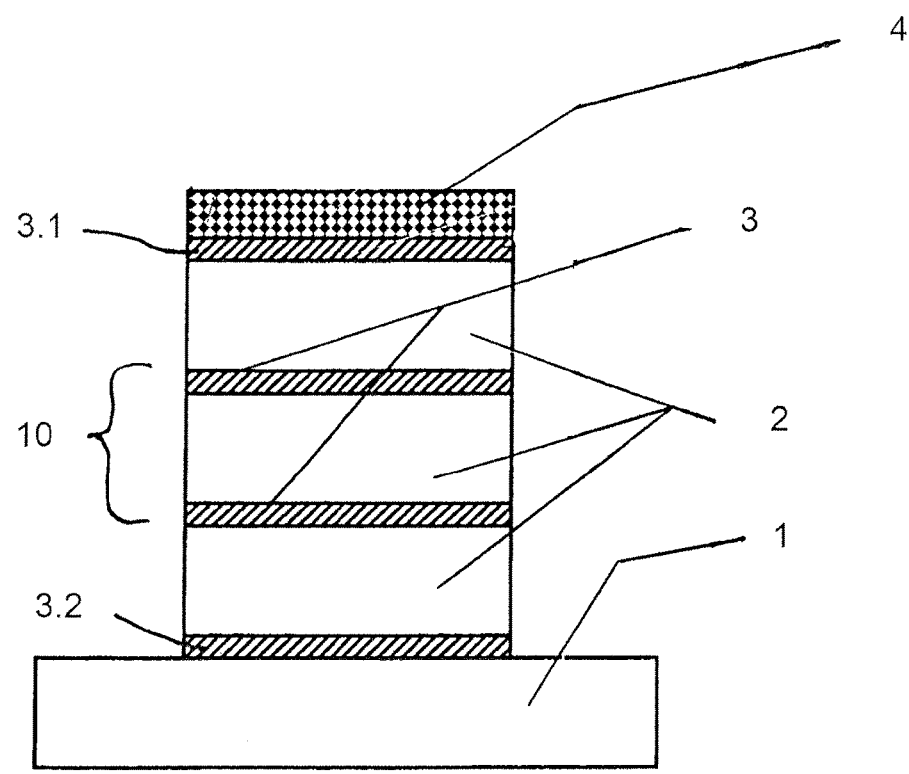
FIG. 1 shows the general view of the device in a schematic and simplified fashion.

The device for precision movement (FIG. 1) contains a bottom 1, to which a group of plates made of a piezoelectric material 2 is attached, said plates being separated by electrodes 3 and forming a base module 10 each. A reading or protecting area or plane 4 can be applied to the upper fixed, non-elastic electrode 3.1 of the upper plate. The lowermost plate 2 is also fixed to the bottom 1 via a fixed, non-elastic electrode 3.2.

A piezoelectric material can be any material, also a polycrystalline one. However, the use of monocrystals having a low degree of hysteresis and creep strain is most useful. It is thus possible to use monocrystals of lithium niobate, strontium-barium-niobate, barium-sodium-niobate and other crystals having a piezo effect. Elastic electrodes 3 having a thickness below 0.5 µm are applied to two opposite sides of the plate 2 by known methods. It is most suitable to use Cr, Cu or In as an electrode material. A reading or protecting layer or plane 4 made of sapphire or of a diamond-like material is applied to the surface of the upper one of the electrodes.

The device is used as follows:

At first, the dependence of the change in the dimensions of the device for precision movement on the voltage which is applied to the electrodes, is polarized identically and has the same value is measured, i.e. a scaling diagram is produced. A scaling diagram is produced by applying a determination voltage to the electrodes of the device and by measuring the corresponding displacement of the reading or protecting layer or plane 4 of the group of piezoelectric plates in the form of the base module.

The displacement is measured according to known methods by means of the region 3D of a laser-assisted interferometric system for measuring nano movements (on the basis of an atomic force microscope and three laser interferometers).

In order to measure a displacement of the rectangular area relative to the electrodes, the device must be arranged in the system for measuring nano movements. The microscopic probes have to be approached to the face of the device at a distance at which the stabilization system operates. It is necessary to apply a voltage to the device and measure the distance by which the plane 4 of the device has been displaced when the voltage is applied. Then, the value of the applied voltage has to be changed and the value of the displacement of the surface of the device has to be measured again.

As a result of several measurements of the displacement, which are made with various voltage values, a results table showing the experimental measurements is to be drafted on the basis of which a scaling diagram is drafted that shows the dependency of the value regarding the displacement of the area of the device in the direction of the rectangular area of the electrodes on the value of the applied voltage.

Different measuring apparatuses can be scaled by means of the device according to the invention.

For scaling any groups (e.g. of a probe microscope) along the normal relative to the investigated area, the recommended device for precision measurement is placed therein. For example, if a scanning probe microscope shall be scaled, the device has to be arranged on a corresponding table of a scanning probe microscope, and it is required to plot the marking of the probes on the face of the device to the distance of the distance (at the order of 0.5 nm) between the upper probe and the face, where the stabilization system operates. The stabilization of the probe can be determined by stabilizing the tunneling current (when operating under tunneling microscope conditions) or by stabilizing the value of the force which acts on the probes (when operating under atomic force microscope conditions). The stabilization of the distance is determined by means of an electron control system which produces the congruence of the signals of the measuring instruments with the predetermined values and the control signals.

When the tested measuring instrument is scaled in the vertical, a fixed voltage is applied to the electrodes of the device for precision movement, which ensures the displacement in the vertical. Here, the area of the device is displaced by a value which is determined according to the scaling table. The stabilization system of the distance ensures a corresponding displacement of the probe to the distance to which the area of the pattern is displaced. The value of the probe displacement is measured by the measuring instrument of the probe microscope. In this way, the value of the display of the measuring instruments of the probe microscope, which measure the distance and on which the probe is displaced, is compared with the corresponding value of the distance, which is taken from the scaling curve to which the area of the device is displaced. Then, the voltage which is applied to the device is changed and the measuring operation is repeated. As a result of measurements made several times with different voltage values, a table is drafted and reflects the ratio of the displacement value of the device and the device display of the probe microscope which measured the probe movement.

Example 2

Figure 3:
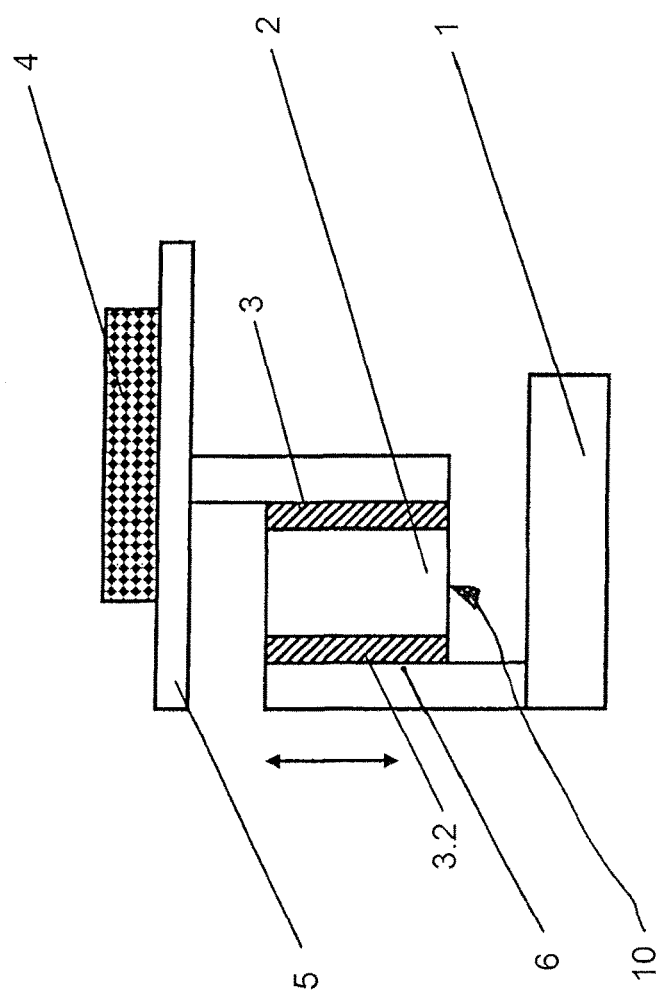
FIG. 3 shows the general view of the device in the embodiment of the development in a schematic and simplified fashion.

The device for precision movement (FIG. 3) contains a bottom 1, to which a plate 2 made of a piezoelectric material is connected. According to the invention, also only non-elastic fixed electrodes 3, 3.2 are applied to the plate thereby forming the base module (10). The plate 2 is connected to the bottom 1 by means of the console 6. The fixed, non-elastic electrode 3.2 is connected to the vertical area thereof. The second electrode 3 of the plate is attached to the second console 5 (T-shaped in the drawing) to which the reading area 4 is attached.

Any known material, also polycrystalline one, can be used as a piezoelectric material. However, it is most useful to use monocrystals having a low degree of hysteresis and creep strain. Thus, it is possible to use monocrystals of lithium niobate, tantalum-lithium, strontium-barium-niobate, barium-sodium-niobate and others which show the piezo effect. Electrodes 3 made of Cr, Cu or In are applied to two opposite plates 2 according to known methods.

Figure 2:
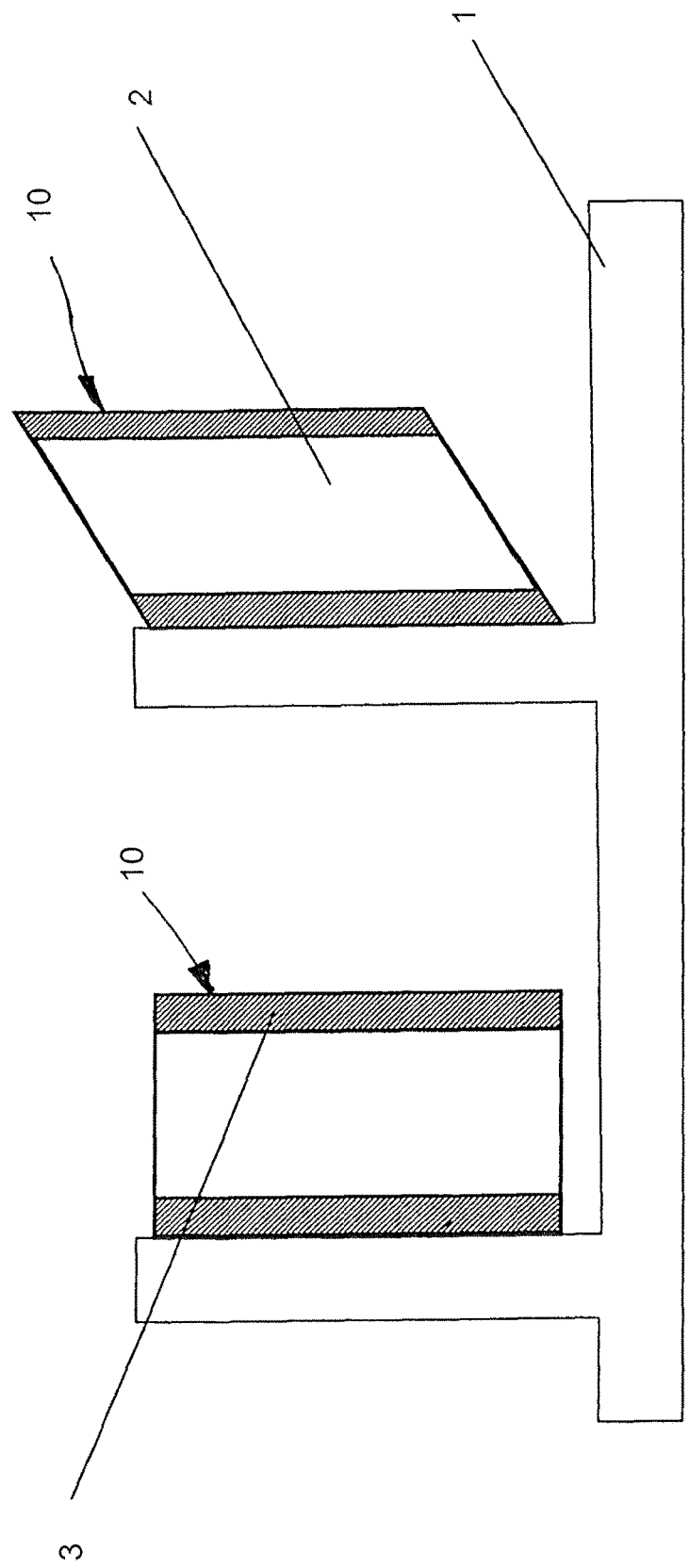
FIG. 2 shows the stages of the operation of the plate made of a piezoelectric material and the deformation of the form thereof when a displacement is made in the direction of the parallel plane of the electrodes.

The device operates as follows: When a voltage from a source is applied to electrodes 3 (not shown in the drawings), the plate 2 made of a piezoelectric material is deformed as shown in FIG. 2. As a result, the T-shaped console 5 is moved up or down in relation to the bottom 1, depending on the applied voltage.

Example 3

Figure 4:
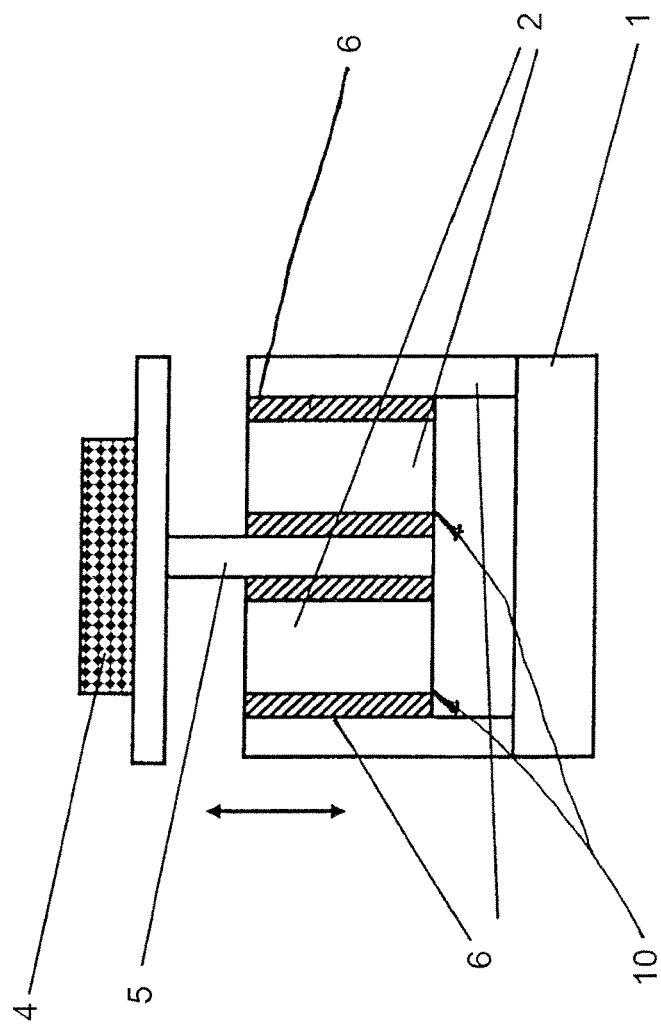
FIG. 4 shows the general view of the device in the embodiment according to FIG. 3 including two plates made of a piezoelectric material in a schematic and simplified fashion.

The device for precision movement (FIG. 4) contains a bottom 1 to which two identical plates 2 made of a piezoelectric material are connected. According to the invention, also only non-elastic fixed electrodes 3, 3.2 are applied to the plates. The connection of the plates 2 to the bottom 1 is determined by means of identical consoles 6. Each of these plates is connected to the vertical areas of the consoles via one of its fixed electrodes 3.2. The plates are connected to the second console 5 (T-shaped in the drawing) via the second electrodes 3 which are disposed between the plates. The reading area 4 is attached to the consoles.

The device operates as follows: When a voltage from a source is applied to the electrodes 3 (not shown in the drawings), the plates 2 made of a piezoelectric material are deformed as shown in FIG. 2. As a result, the T-shaped console 5 is moved up or down in relation to the bottom 1, depending on the polarity of the applied voltage.

The device is used as described in example 1.

Example 4

Figure 5:
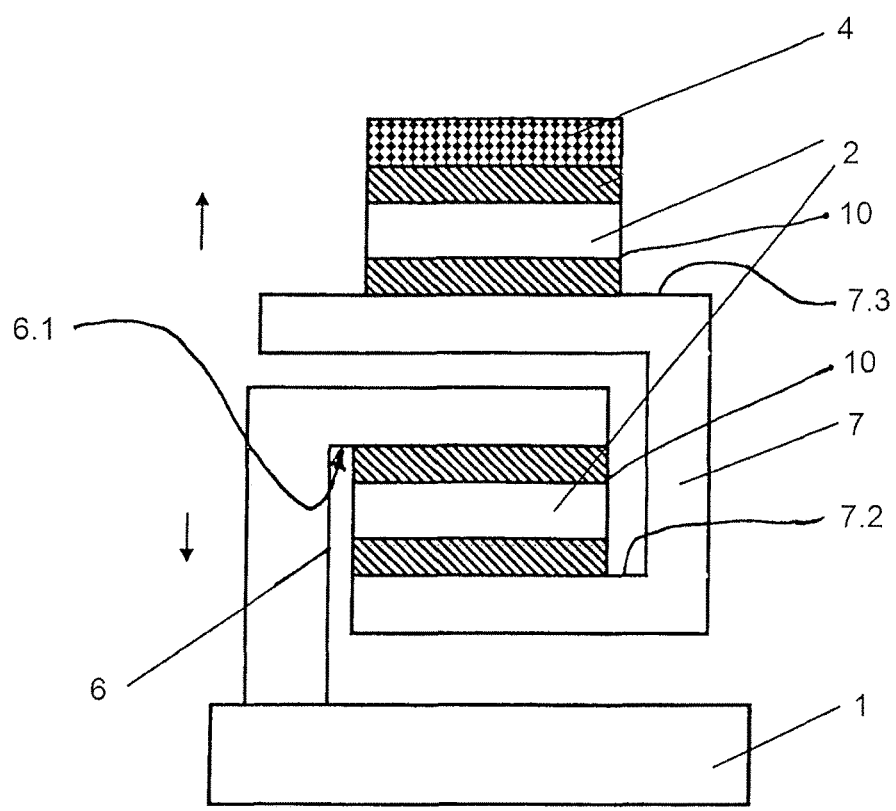
FIG. 5 is a view of the device of a further embodiment.

The device for precision movement (FIG. 5) contains a bottom 1 to which two or more identical plates 2 made of a piezoelectric material are connected. According to the invention, also only fixed non-elastic electrodes are applied to the plates thereby forming one base module 10 each. The connection of the plates 2 to the bottom 1 is defined by means of an L-shaped console 6. The first (lower) plate 2 is attached to the upper electrode on the lower horizontal area 6.1 of the first console. The lower electrode is connected to the upper horizontal area 7.2 of the lower head piece or the lower first U-shaped leg of the U-shaped console 7. Here, the lower electrode of a second (upper) plate 2 (further base module 10) made of a piezoelectric material is provided at the upper area 7.3 of the upper head piece or the upper second U-shaped leg of the second console 7, said base module 10 being identical to the first one and the reading area 4 being disposed on the upper electrode thereof. The piezoelectric material in the plates must be oriented in such a way that the lower and upper plates must be displaced in one and the same direction, namely in the direction of the area of the electrodes, when a voltage is applied to the electrodes thereof.

The device operates as follows: When a voltage from a source is applied to the electrodes 3 (not shown in the drawings), the plates 2 made of a piezoelectric material are deformed, and this is why the reading area 4 is displaced to the side. The device is used as described in example 1.

Example 5

Figure 6:
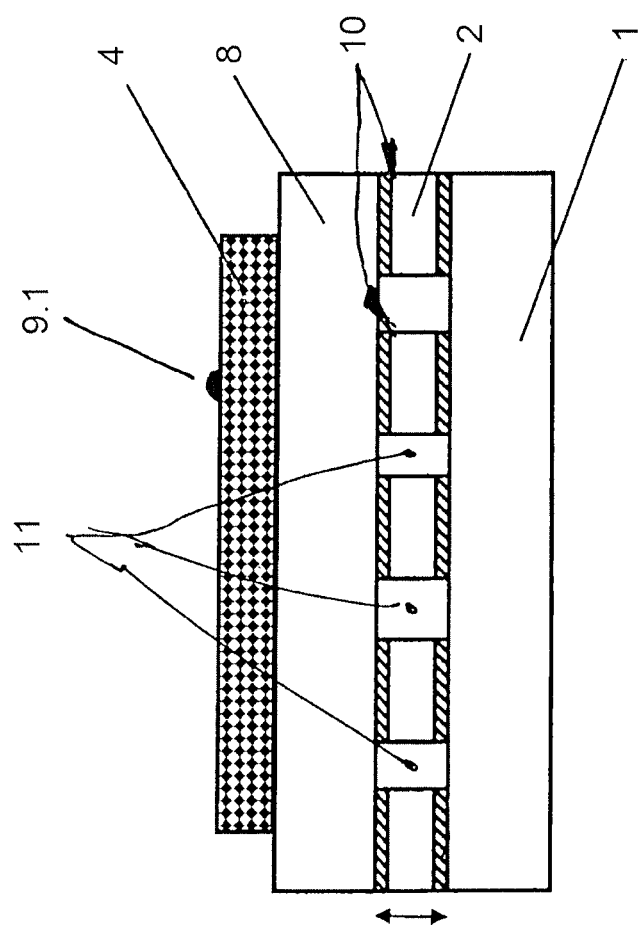
FIG. 6 is a view of the device of yet another embodiment.

The device for precision movement (FIG. 6) contains a bottom 1 to which a group of piezoelectric plates 2 spaced from one another via an intermediate space 11 is connected. According to the invention, each plate is also only equipped with non-elastic fixed electrodes thereby forming a base module 10. An intermediate layer 8 is disposed above the plates and is made of a material having a temperature coefficient of expansion that corresponds to the temperature coefficient of expansion of the material of the bottom 1.

The device operates as follows: When a voltage from a source is applied to the electrodes (not shown in the drawings), the plates 2 made of a piezoelectric material are deformed and the reading area 4 is displaced upwards, downwards or horizontally, depending on the material and orientation of the axes of the crystal lattice, and depending on the polarity of the applied voltage. The device is used as described in example 1.

Example 6

Figure 7:
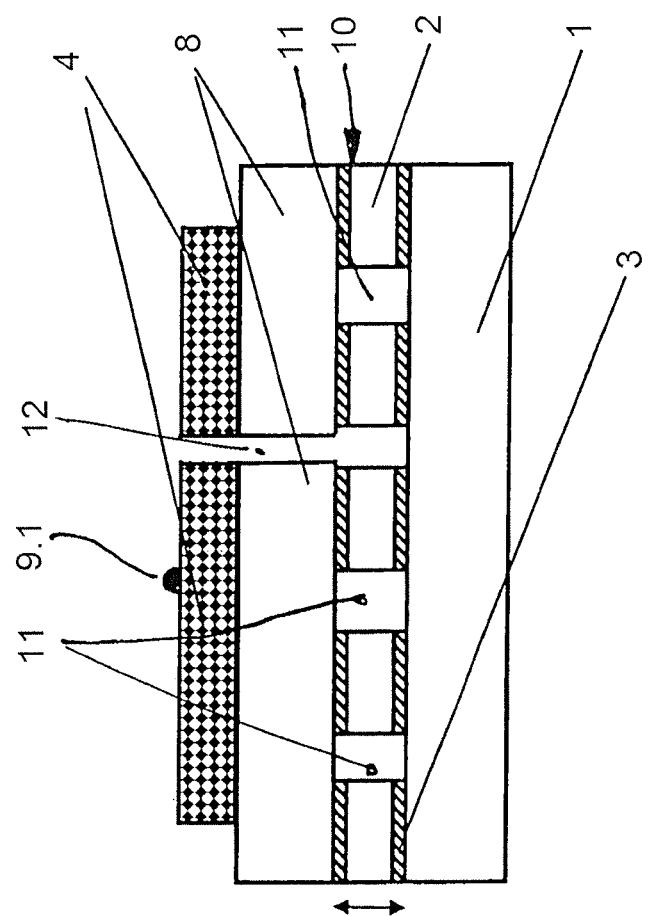
FIG. 7 shows the general view of the device in a last embodiment of the invention in a schematic and simplified fashion.

The device for precision movement (FIG. 7) contains a bottom 1, to which a group of piezoelectric plates 2 spaced from one another via an intermediate space 11 is connected. According to the invention, each of the plates is also only equipped with fixed non-elastic electrodes thereby forming a base module 10. The intermediate layer 8 is disposed above the plates which are separated through a gap 12 and which accommodate the reading areas 4. The intermediate layer consists of a material having a temperature coefficient which is identical to the temperature coefficient of expansion of the material of bottom 1.

The device operates as follows:

When a voltage from a source is applied to the electrodes of the plates 2, the reading areas 4 are displaced in different directions in relation to the bottom 1.

The piezo plates are displaced parallel to one another within each base module. Different directions of displacement of the reading areas 4 among one another are possible:

The reading areas of the second group are displaced towards the bottom 1 at right angles in opposite directions; or they are displaced parallel to the bottom in opposite directions. The reading areas 4 of the groups can also be displaced in directions at right angles to one another (one parallel to the bottom and the second at right angles). The device is used as described in example 1.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A device for performing a precision movement, comprising:
   a plate made of a piezoelectric material;
   electrodes arranged parallel to one another and configured to be connectable to a voltage source having a controlled electrical voltage sufficient to cause a change in at least one of a form and at least one dimension of the plate; and
   a top layer that is at least one of a protecting layer and a reading layer is fixed to a free top side of a base module via a non-elastic fixed electrode,
   wherein
      at least one of the electrodes is a portion of an elastic base module,
      the plate is a monocrystalline material having at least one of a low degree of hysteresis and a low degree of creep strain,
      an orientation of crystal axes of the monocrystalline material is arranged with respect to planes including the electrodes such that when the controlled electrical voltage is applied, a change in at least one of the form and dimensions of the plates is at least one of perpendicular and parallel to the electrodes, and
      a bottom layer that is at least one of a protecting layer and a reading layer is fixed to a bottom side of the base module opposite the free top side of the base module via another non-elastic fixed electrode.

2. The device according to claim 1, wherein
   the plate is formed from at least one of a plurality of stacked, identical plates and base modules having electrodes therebetween, said electrodes being elastic and arranged such that a voltage of equal quantity and direction is applied to each of the electrodes.

* * * * *